United States Patent
Imada et al.

(10) Patent No.: US 8,716,748 B2
(45) Date of Patent: May 6, 2014

(54) SEMICONDUCTOR DEVICE AND METHOD OF MANUFACTURING THE SAME, AND POWER SUPPLY APPARATUS

(75) Inventors: Tadahiro Imada, Kawasaki (JP);
Kazukiyo Joshin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/267,212

(22) Filed: Oct. 6, 2011

(65) Prior Publication Data

US 2012/0049244 A1  Mar. 1, 2012

(30) Foreign Application Priority Data

Mar. 12, 2010 (JP) .................. 2010-270469

(51) Int. Cl.
*H01L 21/02* (2006.01)
(52) U.S. Cl.
USPC .... 257/155; 257/194; 257/332; 257/E29.068; 257/E29.255; 257/E21.09
(58) Field of Classification Search
USPC .............. 257/194, 155, 332, E21.09, 476, 257/29.068, 89, 255; 438/104, 478
See application file for complete search history.

(56) References Cited

U.S. PATENT DOCUMENTS

| | | | | |
|---|---|---|---|---|
| 6,649,287 B2 * | 11/2003 | Weeks et al. | .................. | 428/698 |
| 7,550,781 B2 * | 6/2009 | Kinzer et al. | .................. | 257/183 |
| 7,550,821 B2 * | 6/2009 | Shibata et al. | ................. | 257/615 |
| 2002/0024057 A1 * | 2/2002 | Inokuchi et al. | ............... | 257/155 |
| 2005/0145851 A1 * | 7/2005 | Johnson et al. | .................. | 257/76 |
| 2006/0226412 A1 * | 10/2006 | Saxler et al. | ..................... | 257/11 |
| 2007/0200143 A1 * | 8/2007 | Saito et al. | ..................... | 257/192 |
| 2009/0072356 A1 * | 3/2009 | Sugawara | ..................... | 257/632 |
| 2010/0270591 A1 * | 10/2010 | Ahn | ............................. | 257/194 |
| 2011/0210338 A1 * | 9/2011 | Briere | ............................ | 257/76 |
| 2012/0218783 A1 * | 8/2012 | Imada | ............................ | 363/17 |

FOREIGN PATENT DOCUMENTS

| | | | | |
|---|---|---|---|---|
| JP | 2007273569 | | * 3/2006 | |
| JP | 2007-273569 | | * 10/2007 | ............. H01L 21/60 |
| JP | 2009-124002 A1 | | 6/2009 | |

* cited by examiner

*Primary Examiner* — Michael Lebentritt
(74) *Attorney, Agent, or Firm* — Kratz, Quintos & Hanson, LLP

(57) ABSTRACT

A semiconductor device includes: a substrate; a semiconductor stacked structure, provided over the substrate, including an electron transit layer and an electron supply layer; a gate electrode, a source electrode, and a drain electrode provided over the semiconductor stacked structure; a gate pad, a source pad, and a drain pad provided over the gate electrode, the source electrode, and the drain electrode, and connected to the gate electrode, the source electrode, and the drain electrode, respectively; and a conductive layer provided under the gate pad, the source pad, and the drain pad, wherein a distance between the gate pad and the source pad is smaller than a distance between the gate pad and the drain pad.

20 Claims, 14 Drawing Sheets

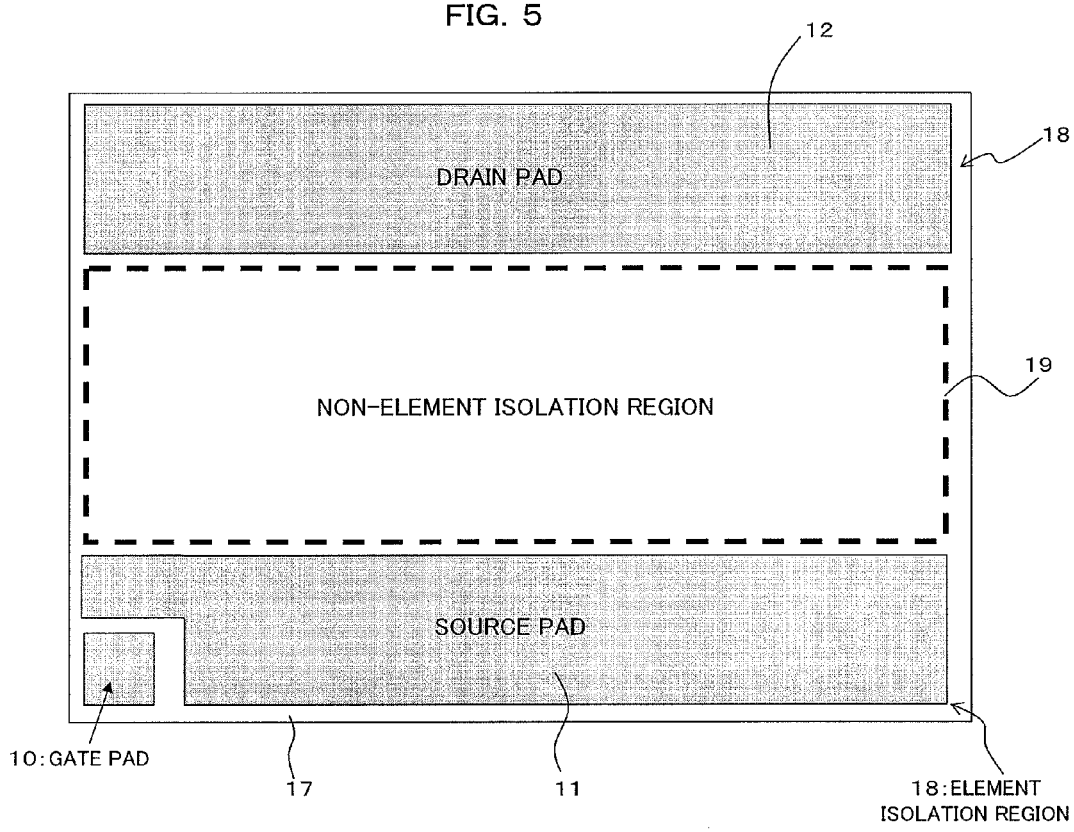

SEMICONDUCTOR DEVICE AND METHOD OF MANUFACTURING THE SAME, AND POWER SUPPLY APPARATUS

CROSS-REFERENCE TO RELATED APPLICATION

This application is based upon and claims the benefit of priority of the prior Japanese Patent Application No. 2010-270469, filed on Dec. 3, 2010, the entire contents of which are incorporated herein by reference.

FIELD

The embodiments discussed herein are related to a semiconductor device and a method of manufacturing the same, and a power supply apparatus.

BACKGROUND

One type of semiconductor devices is a high electron mobility transistor (HEMT) including a semiconductor stacked structure including an electron transit layer and an electron supply layer.

In recent years, efforts to develop GaN-HEMTs with a HEMT structure, have been intensified, which employs a hetero junction between AlGaN and GaN, i.e., GaN-based compound semiconductors, and includes a GaN layer as an electron transit layer and an AlGaN layer as an electron supply layer.

GaN is a material which has a band gap of about 3.4 eV, higher than the band gaps of Si (about 1.1 eV) and GaAs (about 1.4 eV), and has a higher breakdown field strength. GaN is also a material exhibiting a higher saturation electron velocity. Thus, GaN is quite promising as a material for a semiconductor device for a power source, enabling higher voltage operations and providing higher outputs. GaN-HEMTs are also promising for high-efficiency switching elements used for power supply apparatus provided in electronic apparatuses, and power devices with higher withstanding voltage used in electric vehicles.

SUMMARY

A semiconductor device and a power supply apparatus include: a substrate; a semiconductor stacked structure, provided over the substrate, including an electron transit layer and an electron supply layer; a gate electrode, a source electrode, and a drain electrode provided over the semiconductor stacked structure; a gate pad, a source pad, and a drain pad provided over the gate electrode, the source electrode, and the drain electrode, and connected to the gate electrode, the source electrode, and the drain electrode, respectively; and a conductive layer provided under the gate pad, the source pad, and the drain pad, wherein a distance between the gate pad and the source pad is smaller than a distance between the gate pad and the drain pad.

A semiconductor device and a power supply apparatus include: a substrate; a semiconductor stacked structure, provided over the substrate, including an electron transit layer and an electron supply layer; a gate electrode, a source electrode, and a drain electrode provided over the semiconductor stacked structure; a gate pad, a source pad, and a drain pad provided over the gate electrode, the source electrode, and the drain electrode, and connected to the gate electrode, the source electrode, and the drain electrode, respectively; and a conductive layer provided over a back face of the substrate, and below the gate pad and the source pad.

A semiconductor device and a power supply apparatus include: a substrate; a semiconductor stacked structure, provided over the substrate, including an electron transit layer and an electron supply layer; a gate electrode, a source electrode, and a drain electrode provided over the semiconductor stacked structure; a gate pad, a source pad, and a drain pad provided over the gate electrode, the source electrode, and the drain electrode, and connected to the gate electrode, the source electrode, and the drain electrode, respectively; an element isolation region; and a non-element isolation region other than the element isolation region, wherein the drain pad is provided over the element isolation region, and the gate pad and the source pad are provided over the non-element isolation region.

A method of manufacturing a semiconductor device, includes: forming a semiconductor stacked structure including an electron transit layer and an electron supply layer, over a conductive substrate or a substrate including a conductive layer; forming a gate electrode, a source electrode, and a drain electrode over the semiconductor stacked structure; forming a gate pad, a source pad, and a drain pad over the gate electrode, the source electrode, and the drain electrode, such that the gate pad, the source pad, and the drain pad are connected to the gate electrode, the source electrode, and the drain electrode, respectively, and such that a distance between the gate pad and the source pad is smaller than a distance between the gate pad and the drain pad.

A method of manufacturing a semiconductor device, includes: forming a semiconductor stacked structure including an electron transit layer and an electron supply layer, over a substrate; forming a gate electrode, a source electrode, and a drain electrode over the semiconductor stacked structure; forming a gate pad, a source pad, and a drain pad over the gate electrode, the source electrode, and the drain electrode, such that the gate pad, the source pad, and the drain pad are connected to the gate electrode, the source electrode, and the drain electrode, respectively; and forming a conductive layer over a back face of the substrate, and below the gate pad and the source pad.

A method of manufacturing a semiconductor device, includes: forming a semiconductor stacked structure including an electron transit layer and an electron supply layer, over a substrate; forming an element isolation region; forming a gate electrode, a source electrode, and a drain electrode over the semiconductor stacked structure; forming a drain pad over the element isolation region such that a gate pad, a source pad, and the drain pad is connected to the gate electrode, the source electrode, and the drain electrode over the gate electrode, the source electrode, and the drain electrode, respectively, and forming the gate pad and the source pad over a non-element isolation region other than the element isolation region.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 5 is a schematic plan view illustrating the pad layout of the semiconductor device according to the first embodiment;

DESCRIPTION OF EMBODIMENTS

Hereinafter, a semiconductor device and a method of manufacturing the same, and a power supply apparatus according to embodiments will be described with reference to the drawings.

[First Embodiment]

A semiconductor device and a method of manufacturing the same according to a first embodiment will be described with reference to FIGS. 1-7B.

A semiconductor device according to the present embodiment is a HEMT including a semiconductor stacked structure including an electron transit layer and an electron supply layer. For example, the semiconductor device is a compound semiconductor device based on a nitride-based compound semiconductor, such as a GaN-based compound semiconductor, for example. Note that a HEMT based on a GaN-based compound semiconductor is referred to as a GaN-HEMT or GaN-based HEMT.

Hereinafter, the description will be made with reference to a GaN-HEMT having a HEMT structure, wherein a GaN layer as an electron transit layer, and an AlGaN layer as an electron supply layer, are stacked together, for use in a power supply used in switching elements provided in electronic devices (electronic appliances) and power supply apparatuses.

Figure 1:
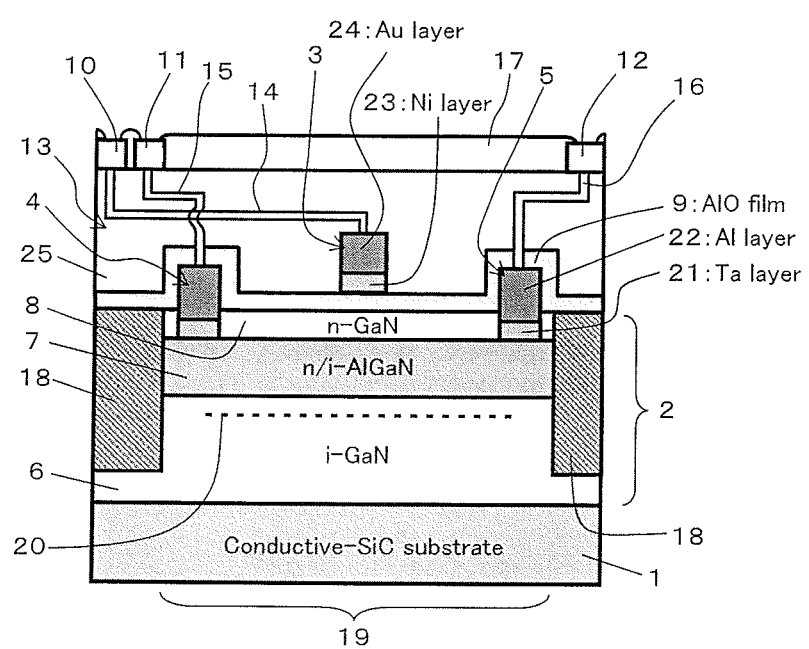
FIG. 1 is a schematic cross-sectional view illustrating the structure of a semiconductor device (GaN-HEMT) according to a first embodiment.

As depicted in FIG. 1, this GaN-HEMT includes, a substrate 1, a semiconductor stacked structure 2 provided over the substrate 1, and a gate electrode 3, a source electrode 4, and drain electrode 5, provided over the semiconductor stacked structure 2. Note that a GaN-HEMT is also referred to as a GaN transistor.

In the present embodiment, the substrate 1 is a conductive substrate. Here, the substrate 1 is a conductive SiC substrate, i.e., an n-type SiC substrate or a p-type SiC substrate.

The semiconductor stacked structure 2 is a semiconductor stacked structure including an electron transit layer 6 and an electron supply layer 7. In this embodiment, the semiconductor stacked structure 2 has a structure wherein an i-GaN electron transit layer 6, an n-AlGaN electron supply layer 7 including an i-AlGaN spacer layer, and an n-GaN cap layer 8 are stacked. Note that the reference symbol 20 denotes a two-dimensional electron gas layer in FIG. 1. The semiconductor stacked structure 2 may be any layer including an electron transit layer 6 and an electron supply layer 7, and may have a different stack structure.

Over the semiconductor stacked structure 2 as configured above, the gate electrode 3, the source electrode 4, and the drain electrode 5 are provided.

In this embodiment, the source electrode 4 and the drain electrode 5, made from Ta/Al, for example, are provided over the n-AlGaN electron supply layer 7.

An AlO film (insulation film) 9 is provided over the n-GaN cap layer 8, and the gate electrode 3 made from Ni/Au, for example, is provided over the AlO film 9. In other words, the gate electrode 3 is provided over the n-GaN cap layer 8, interposing the AlO film 9 as a gate insulation film.

As described above, this GaN-HEMT is a metal insulator semiconductor (MIS) transistor including a gate insulation film.

In the present embodiment, the AlO film 9 is provided so as to cover the entire surface of the semiconductor stacked structure 2, i.e., the entire surface of the n-GaN cap layer 8 and the surfaces (side faces and top faces) of the source electrode 4 and the drain electrode 5. In other words, the AlO film 9 function as a gate insulation film right below the gate electrode 3, while functioning as a passivation film in other regions.

Although AlO is used as a material for the insulation film herein, this is not limiting. For example, an oxide, a nitride, or an oxinitride containing any of Si, Al, Hf, Zr, Ti, Ta, and W, may also be used.

This GaN-HEMT further includes a gate pad 10, a source pad 11, and a drain pad 12 over the gate electrode 3, the source electrode 4, and the drain electrode 5.

More specifically, the gate pad 10, the source pad 11, and the drain pad 12 are provided over the gate electrode 3, the source electrode 4, and the drain electrode 5, interposing an insulation film 25, and the interconnection layer 13 including metal interconnections 14-16 provided in the insulation film 25. The gate pad 10, the source pad 11, and the drain pad 12 are connected to the gate electrode 3, the source electrode 4, and the drain electrode 5, via the gate interconnection 14, the source interconnection 15, and the drain interconnection 16 included in the interconnection layer 13.

The pads 10-12 are made from a metal and thus are conductive. The pads 10-12 are bonding pads. An insulation film 17 is formed between the respective pads 10-12.

Particularly, the present embodiment includes a conductive substrate 1, as a conductive layer, under the gate pad 10, the source pad 11, and the drain pad 12. More specifically, the conductive substrate 1 is provided as a conductive layer, under the gate pad 10, the source pad 11, and the drain pad 12, in the regions corresponding to the gate pad 10, the source pad 11, and the drain pad 12.

The layout of pads 10-12 is designed such that the distance between the gate pad 10 and the source pad 11 is smaller than the distance between the gate pad 10 and the drain pad 12.

In other words, by providing the conductive substrate 1 as a conductive layer under the pads 10-12 as set forth above, respective capacitances are generated between the gate pad 10 and the conductive layer 1, between the source pad 11 and the conductive layer 1, and between the drain pad 12 and the conductive layer 1. Here, the capacitance between the gate pad 10 and the conductive layer 1 is denoted by Cgp, the capacitance between the source pad 11 and the conductive layer 1 is denoted by Csp, the capacitance between the drain pad 12 and the conductive layer 1 is denoted by Cdp.

The pad layout as described above helps to increase the gate-source capacitance Cgs, without causing an increase in the gate-drain capacitance Cgd, as will be described below.

This suppresses a self turn-on, a phenomenon wherein a transistor turns on when it is off, and ensures appropriate operations of the transistor, enabling stable operations.

In other words, the GaN-HEMT has a significant advantage in that the HEMT structure reduces the input capacitance and accordingly provides an increased switching speed, thereby reducing switching losses. On the other hand, due to the reduced input capacitance, when the transistor is turned off, a sharp increase in the drain voltage would result in an increase in the gate voltage, thereby inducing a self turn-on. To address this, the above-described configuration is aiming at suppressing a self turn-on to ensure stable operations, while maintaining the above-described advantage.

Hereinafter, details will be described.

Figure 2:
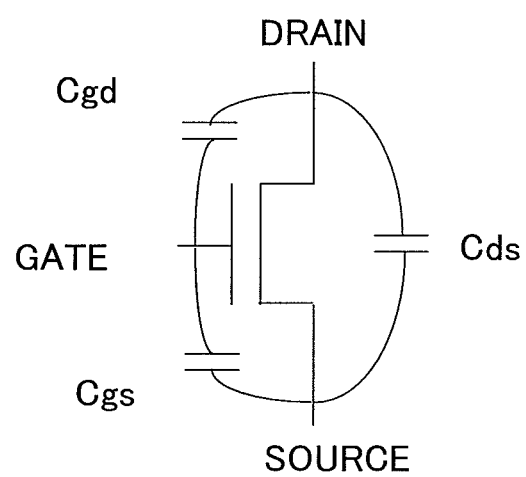
FIG. 2 is a schematic diagram illustrating an equivalent circuit of a transistor in the semiconductor device according to the first embodiment.

Here, FIG. 2 is an equivalent circuit of the transistor.

Initially, the source is grounded, the gate is floated (i.e., the gate voltage Vg is set to the initial voltage of 0 V), and the drain voltage Vd is set to 0 V. The gate voltage Vg, when the drain voltage Vd is increased, can be expressed by the following formula (1), based on the charge conservation of the gate, where Cgs is the gate-source capacitance, Cgd is the gate-drain capacitance is, and Cds is the drain-source capacitance:

$$Cgd(Vg-Vd)+CgsVg=0$$

$$Vg=(1/(1+Cgs/Cgd))Vd \qquad (1)$$

When the transistor is off, e.g., when the voltage applied to the gate is set to 0V in a normally-off device, the drain voltage Vd is increased. When the gate voltage Vg eventually exceeds the threshold voltage Vth, a self turn-on of the transistor occurs, which is a phenomenon wherein the transistor turns on. Although the gate is rarely floated in actual operations, a self turn-on may occur if the gate voltage Vg reaches the threshold voltage Vth as a result of an increase in the drain voltage, depending on the gate-source resistance, when the transistor is turned off.

On the other hand, the above formula (1) indicates that the gate voltage Vg is reduced with an increase in Cgs/Cgd. In other words, it becomes difficult for the gate voltage Vg to exceed the threshold voltage Vth, as the value of Cgs/Cgd increases, and the occurrence of a self turn-on is thus reduced.

Thus, a self turn-on can be suppressed by increasing the value of Cgs/Cgd in the above formula (1) such that the gate voltage Vg does not exceed the threshold voltage Vth.

Accordingly, the above-described configuration increases the gate-source capacitance Cgs to increase the value of Cgs/Cgd in the above formula (1), without causing an increase in the gate-drain capacitance Cgd, thereby suppressing a self turn-on.

In other words, by providing the conductive substrate 1 as a conductive layer under the pads 10-12 as set forth above, respective capacitances Cgp, Csp, and Cdp are generated between the gate pad 10 and the conductive layer 1, between the source pad 11 and the conductive layer 1, and between the drain pad 12 and the conductive layer 1.

Figure 3:
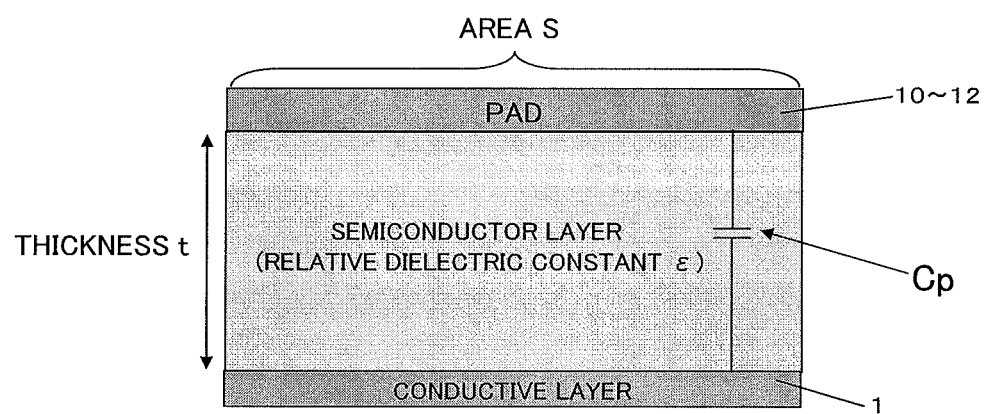
FIG. 3 is a schematic diagram illustrating the capacitance between a pad and a conductive layer provided in the semiconductor device according to the first embodiment.

Here, as depicted in FIG. 3, the capacitance Cp between the pads 10-12, which are made from a metal and thus conductive, and the conductive layer 1 is expressed by the following formula (2), where $\epsilon$ is the relative dielectric constant of the semiconductor layer (which is non-conductive) between the pads 10-12 and the conductive layer 1, $\epsilon o$ is the vacuum dielectric constant, S is the areas of the pads 10-12, and t is the distance between the pads 10-12 and the conductive layer 1:

$$Cp=\epsilon \times \epsilon o \times S/t \qquad (2)$$

Here, the capacitance Cgp between the gate pad 10 and the conductive layer 1, the capacitance Csp between the source pad 11 and the conductive layer 1, and the capacitance Cdp between the drain pad 12 and the conductive layer 1, are primarily determined by the areas of the respective pads 10-12. Thus, the gate pad-conductive layer capacitance Cgp and the source pad-conductive layer capacitance Csp can be adjusted by adjusting the areas of the gate pad 10 and the source pad 11, thereby adjusting the gate-source capacitance Cgs.

As described above, in this embodiment, the gate pad 10, the source pad 11, and the drain pad 12 are connected to the gate electrode 3, the source electrode 4, and the drain electrode 5, via the gate interconnection 14, the source interconnection 15, and the drain interconnection 16, respectively. The respective capacitances between the pads 10-12 and the conductive layer 1 are connected to each other, via the conductive layer 1 and the insulation film 17.

Figure 4:
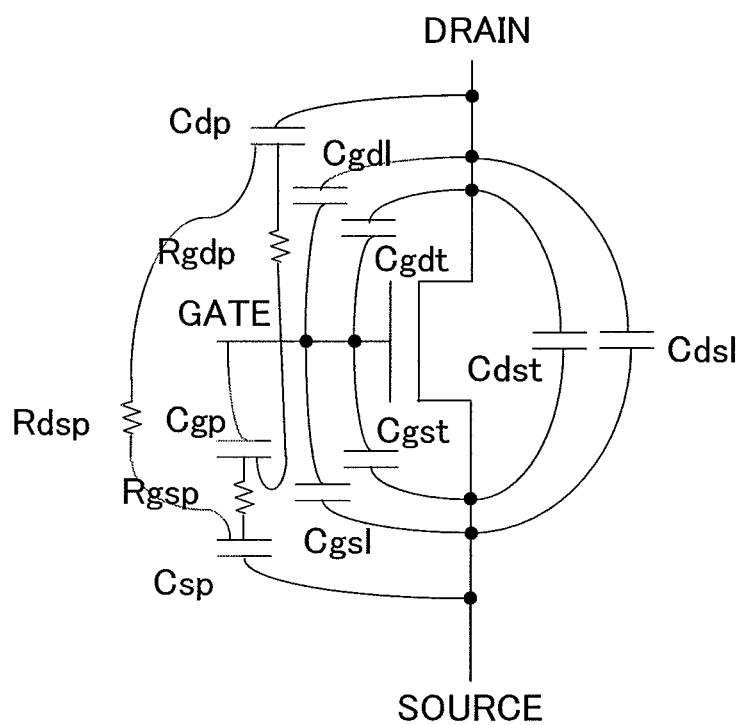
FIG. 4 is a schematic diagram illustrating an equivalent circuit of a transistor in the semiconductor device according to the first embodiment.

Thus, the equivalent circuit of the transistor including the respective capacitances between the pads 10-12 and the conductive layer 1, the capacitances of the interconnections 14-16 are depicted in FIG. 4.

Here, the gate-source capacitance is denoted by Cgs, the gate-drain capacitance is denoted by Cgd, and the drain-source capacitance is denoted by Cds. Furthermore, the capacitance between the gate electrode and the source electrode is denoted by Cgst, the capacitance between the gate electrode and the drain electrode is denoted by Cgdt, the capacitance between the drain electrode and the source electrode is denoted by Cdst. Furthermore, the capacitance between the gate interconnection and the source interconnection is denoted by Cgsl, the capacitance between the gate interconnection and the drain interconnection is denoted by Cgdl, and the capacitance between the drain interconnection and the source interconnection is denoted by Cdsl. In addition, the capacitance between the gate pad 10 and the conductive layer 1 is denoted by Cgp, the capacitance between the source pad 11 and the conductive layer 1 is denoted by Csp, the capacitance between the drain pad 12 and the conductive layer 1 is denoted by Cdp. Furthermore, the resistance between the gate pad-conductive layer capacitance Cgp and the source pad-conductive layer capacitance Csp, i.e., the gate pad-source pad resistance, is denoted by Rgsp; the resistance between the gate pad-conductive layer capacitance Cgp and the drain pad-conductive layer capacitance Cdp, i.e., the gate pad-drain pad resistance, is denoted by Rgdp, and the resistance between the drain pad-conductive layer capacitance Cdp and the source pad-conductive layer capacitance Csp, i.e., the drain pad-source pad resistance, is denoted by Rdsp.

In this embodiment, the pads 10-12 are formed over the interconnection layer 13, and the insulation film 17 is provided between the respective pads 10-12. Thus, the respective resistances Rgsp, Rgdp, Rdsp between the pads are proportional to the corresponding distances between the pads. If the distance between pads is sufficiently shorts, the resistance between these pads can be ignored.

In the present embodiment, as set forth above, the distance between the gate pad 10 and the source pad 11 is made smaller than the distance between the gate pad 10 and the drain pad 12. In other words, the pad layout is designed such that the source pad 11 is disposed close to the gate pad 10, while the drain pad 12 is disposed distant apart from the gate pad 10.

Specifically, as depicted in FIG. 5, the distance between the gate pad 10 and the source pad 11 is made sufficiently short, while the distance between the gate pad 10 and the drain pad 12 is made sufficiently long.

In other words, by making the distance between the gate pad 10 and the source pad 11 sufficiently short, the gate pad-source pad resistance Rgsp is made sufficiently small, thereby effectively increasing the connection between the gate pad-conductive layer capacitance Cgp and the source pad-conductive layer capacitance Csp. On the other hand, by making the distance between the gate pad 10 and the drain pad 12 sufficiently long, the gate pad-drain pad resistance Rgdp is made sufficiently large, thereby effectively reducing the connection between the gate pad-conductive layer capacitance Cgp and the drain pad-conductive layer capacitance Cdp.

As a result, the gate pad-source pad resistance Rgsp is made sufficiently small, facilitating exchange of charges between the gate pad-conductive layer capacitance Cgp and the source pad-conductive layer capacitance Csp. Thus, the gate-source capacitance Cgs includes the composite capacitance of the gate pad-conductive layer capacitance Cgp and the source pad-conductive layer capacitance Csp. Accordingly, the gate-source capacitance Cgs can be expressed by the following formula (3):

$$Cgs = Cgst + Cgsl + 1/(1/Csp + 1/Cgp) \quad (3)$$

On the other hand, the gate pad-drain pad resistance Rgdp is made sufficiently large, inhibiting exchange of charges between the gate pad-conductive layer capacitance Cgp and the drain pad-conductive layer capacitance Cdp. Thus, the gate-drain capacitance Cgd does not include the composite capacitance of the gate pad-conductive layer capacitance Cgp and the drain pad-conductive layer capacitance Cdp. Accordingly, the gate-drain capacitance Cgd can be expressed by the following formula (4):

$$Cgd = Cgdt + Cgdl \quad (4)$$

In this manner, by adjusting the respective resistances between capacitances generated by the conductive layer 1 provided under the pads 10-12 by designing the pad layout, the resultant capacitances are added to the gate-source capacitance Cgs, without adding them to the gate-drain capacitance Cgd. Thereby, the gate-source capacitance Cgs is increased without causing an increase in the gate-drain capacitance Cgd, thereby increasing the value Cgs/Cgd in the above formula (1). This suppresses a self turn-on, enabling stable operations.

Therefore, in the present embodiment, the distance between the gate pad 10 and the source pad 11 is set such that the gate pad-conductive layer capacitance Cgp and the source pad-conductive layer capacitance Csp is added to the gate-source capacitance Cgs. In contrast, the distance between the gate pad 10 and the drain pad 12 is set such that the gate pad-conductive layer capacitance Cgp and the drain pad-conductive layer capacitance Cdp are not added to the gate-drain capacitance Cgd.

As depicted in FIGS. 1 and 5, this GaN-HEMT includes element isolation regions 18 and a non-element isolation region (transistor region) 19 other than the element isolation regions 18. Here, the element isolation regions 18 are regions imparted with a high resistance by the element isolation, while the non-element isolation region 19 is a region not imparted with a high resistance by the element isolation. The gate pad 10, the source pad 11, and the drain pad 12 are provided over the element isolation regions 18. In this case, the n-GaN cap layer 8 and the two-dimensional electron gas layer 20 are isolated between the pads 10-12 and the conductive substrate 1 as a conductive layer, thereby being imparted with a high resistance. Thus, the n-GaN cap layer 8 and the two-dimensional electron gas layer 20 do not function as conductive layers which generate capacitances with the respective pads 10-12. In FIG. 5, the regions not enclosed with the dotted line are the element isolation regions 18.

Hereinafter, a method of manufacturing the semiconductor device (GaN-HEMT) according to the present embodiment will be explained with reference to FIGS. 6A-6D, 7A, and 7B.

Figure 6A:
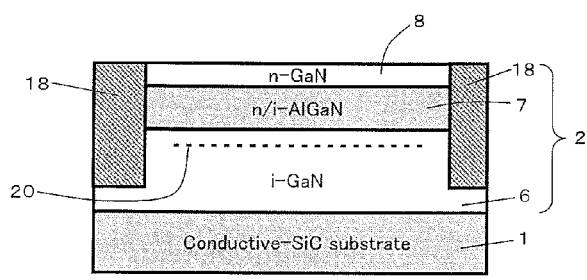
FIGS. 6A to 6D are schematic cross-sectional views illustrating a method of manufacturing the semiconductor device according to the first embodiment.

Initially, as depicted in FIG. 6A, over a conductive SiC substrate 1, an i-GaN electron transit layer 6, an n-AlGaN electron supply layer 7 containing an i-AlGaN spacer layer, and an n-GaN cap layer 8 are formed with metal organic vapor phase epitaxy (MOVPE), for example. In this process, the semiconductor stacked structure 2 including the electron transit layer 6 and the electron supply layer 7 is formed over the conductive substrate 1.

In this embodiment, the i-GaN electron transit layer 6 has a thickness of about 3 μm. The i-AlGaN spacer layer has a thickness of about 5 nm. The n-AlGaN electron supply layer 7 has a thickness of about 30 nm, and an Si doping concentration of about $5 \times 10^{18}$ cm$^{-3}$. The n-GaN cap layer 8 has a thickness of about 10 nm, and an Si doping concentration of about $5 \times 10^{18}$ cm$^{-3}$.

Subsequently, a resist film having openings in the regions wherein element isolation regions are to be formed, is formed over the n-GaN cap layer 8, with photolithography, for example, and then element isolation regions 18 are formed with ion implant, for example. In this embodiment, ion implant is performed from the front face side of the semiconductor stacked structure 2 to the depth of some midpoint of the i-GaN electron transit layer 6 to impart a high resistance, thereby forming the element isolation regions 18. The resist film is then removed. Note that the process of forming the element isolation regions 18 is limited to the above one. For example, grooves may be formed with dry etching using a chlorine-based gas, and an insulation film is filled into the grooves to form the element isolation regions 18.

Figure 6B:
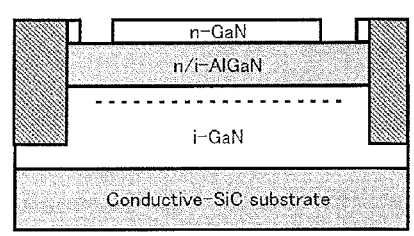
Figure 6C:
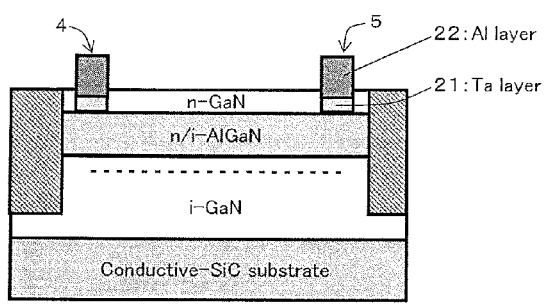

Subsequently, as depicted in FIGS. 6B and 6C, a source electrode 4 and a drain electrode 5 are formed over the n-AlGaN electron supply layer 7.

More specifically, a resist film, which is not illustrated, is formed which has openings in respective regions wherein source and drain electrodes are to be formed, is formed over the n-GaN cap layer 8 with photolithography, for example.

Subsequently, as depicted in FIG. 6B, the n-GaN cap layer 8 is removed in the regions wherein source and drain electrodes are to be formed, with dry etching using a chlorine-based gas, for example. While the entire n-GaN cap layer 8 is removed while remaining the n-AlGaN electron supply layer 7 intact, a portion of the n-GaN cap layer 8 may be removed or a portion of the n-AlGaN electron supply layer 7 may be removed.

Subsequently, as depicted in FIG. 6C, a Ta layer 21 with a thickness of about 20 nm and an Al layer 22 with a thickness of about 200 nm are formed, for example, in the regions wherein source and drain electrodes are to be formed over the n-AlGaN electron supply layer 7, with photolithography and evaporation and lift-off technique, for example. In this embodiment, a stacked structure having the Ta layer 21 as the lower layer, is formed.

As a result, over the n-AlGaN electron supply layer 7, the source electrode 4 and the drain electrode 5 made from Ta/Al layers are provided.

Thereafter, the ohmic characteristic is established by annealing at a temperature from about 400° C. to about 1000° C., such as at about 550° C., for example, in nitrogen atmosphere, for example.

Figure 6D:
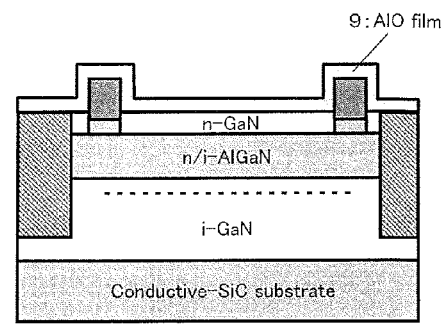

Subsequently, as depicted in FIG. 6D, an AlO film (insulation film) 9 is formed over the entire surface of the wafer. More specifically, the AlO film 9 is formed so as to cover the entire surface of the n-GaN cap layer 8, and the surfaces of the source electrode 4 and the drain electrode 5. In this embodiment, for example, an AlO film with a thickness of about 10 nm is formed. The AlO film 9 formed right below the gate electrode 3 function as a gate insulation film, while the AlO film 9 formed in the other portions function as a passivation film.

Note that the insulation film 9 may have a thickness from about 2 nm to about 200 nm, for example. For forming the insulation film 9, the ALD, plasma CVD, or sputtering technique is preferably used. For example, an oxide, a nitride, or an oxinitride containing any of Si, Al, Hf, Zr, Ti, Ta, and W, may be used as the material for the insulation film 9.

Figure 7A:
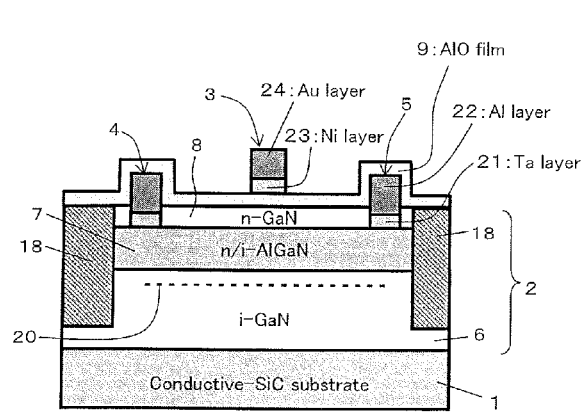
FIGS. 7A and 7B are schematic cross-sectional views illustrating the method of manufacturing the semiconductor device according to the first embodiment.

Subsequently, as depicted in FIG. 7A, a gate electrode 3 is formed over the AlO film 9. In other words, for example, a Ni layer 23 with a thickness of about 30 nm and an Au layer 24 with a thickness of about 400 nm, for example, are formed in the region wherein a gate electrode is to be formed over the AlO film 9, with photolithography and evaporation and lift-off techniques. Thereby, the gate electrode 3 made from a Ni/Au layer is formed over the AlO film 9.

In this manner, the gate electrode 3, the source electrode 4, and the drain electrode 5 are formed over the semiconductor stacked structure 2.

Figure 7B:
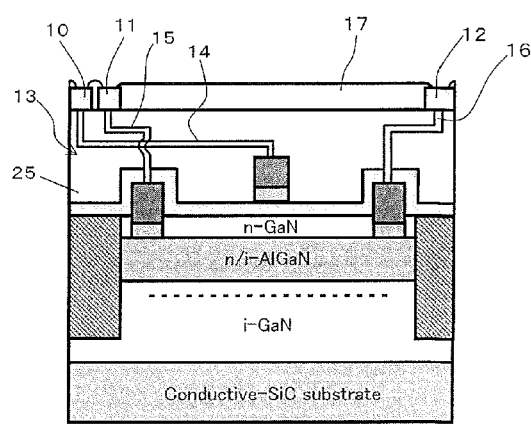

Subsequently, as depicted in FIG. 7B, an insulation film 25 and an interconnection layer 13 including metal interconnections 14-16, and bonding pads 10-12 are formed.

More specifically, the gate interconnection 14 connected to the gate electrode 3, the source interconnection 15 connected to the source electrode 4, and the drain interconnection 16 connected to the drain electrode 5 are formed, interposing the insulation film 25. A gate pad 10 connected to the gate electrode 3 via the gate interconnection 14, a source pad 11 connected to the source electrode 4 via the source interconnection 15, and a drain pad 12 connected to the drain electrode 5 via the drain interconnection 16, are also formed. In this manner, the gate pad 10, the source pad 11, and the drain pad 12 are formed over the gate electrode 3, the source electrode 4, and the drain electrode 5 so as to be connected to the gate electrode 3, the source electrode 4, and the drain electrode 5, respectively. In the present embodiment, the gate pad 10, the source pad 11, and the drain pad 12 are provided over the element isolation regions 18.

In this embodiment, the gate pad 10, the source pad 11, and the drain pad 12 are formed such that the distance between the gate pad 10 and the source pad 11 is smaller than the distance between the gate pad 10 and the drain pad 12.

In the present embodiment, the gate pad 10 and the source pad 11 are formed such that the distance between the gate pad 10 and the source pad 11 becomes a distance being capable of adding the gate pad-conductive layer capacitance Cgp and the source pad-conductive layer capacitance Csp to the gate-source capacitance Cgs. On the other hand, the gate pad 10 and the drain pad 12 are formed such that the distance between the gate pad 10 and the drain pad 12 becomes a distance not being capable of adding the gate pad-conductive layer capacitance Cgp and the drain pad-conductive layer capacitance Cdp to the gate-drain capacitance Cgd.

The semiconductor device (GaN-HEMT) according to the present embodiment may be fabricated in the steps set forth above.

Accordingly, the semiconductor device and the method of manufacturing the same according to the present embodiment is advantageous in that a self turn-on is suppressed, thereby achieving stable operations.

A GaN-HEMT was fabricated in accordance with the above-described steps and was mounted on a PFC circuit of a fifth embodiment, which will be described later. The GaN-HEMT was actually operated for 10 minutes and its operation waveform was determined using an oscilloscope, and no self turn-on was observed. In contrast, a self turn-on was observed in a GaN-HEMT having a semi-insulating SiC substrate, in place of the conductive SiC substrate. A self turn-on was also observed in a GaN-HEMT wherein the distance between the gate pad 10 and the source pad 11 was set to be equal to the distance between the gate pad 10 and the drain pad 12, and another GaN-HEMT wherein both the source pad 11 and the drain pad 12 were disposed sufficiently distant from the gate pad 10.

While a conductive substrate was used as a conductive layer provided under the pads 10-12 in the above-described embodiment, this is not limiting. For example, a substrate including a conductive layer over its front face may also be used. For example, an insulating substrate (high resistance substrate) or semi-insulating substrate including a conductive layer over its front face may be used.

Furthermore, while a conductive SiC substrate is used as a conductive substrate in the above-described embodiment, this is not limiting. For example, other conductive semiconductor substrates, such as a conductive Si substrate and a conductive GaN substrate, may also be used.

Furthermore, while a self turn-on is suppressed by increasing the value of Cgs/Cgd in the above formula (1) with the pad layout in the above-described embodiment, this is not limiting. For example, a self turn-on may be suppressed by increasing the value of Cgs/Cgd in the above formula (1) with a combination of the pad layout and the interconnection layout.

In order to increase the value of Cgs/Cgd in the above formula (1) with the interconnection layout, the gate interconnection 14, the source interconnection 15, and the drain interconnection 16 maybe provided such that the number of locations where the gate interconnection 14 and the source interconnection 15 are disposed on opposite sides of the insulation film 25 sandwiching the insulation film 25 is greater than the number of locations where the gate interconnection 14 and the drain interconnection 16 are disposed on opposite sides of the insulation film 25 sandwiching the insulation film 25.

Figure 8:
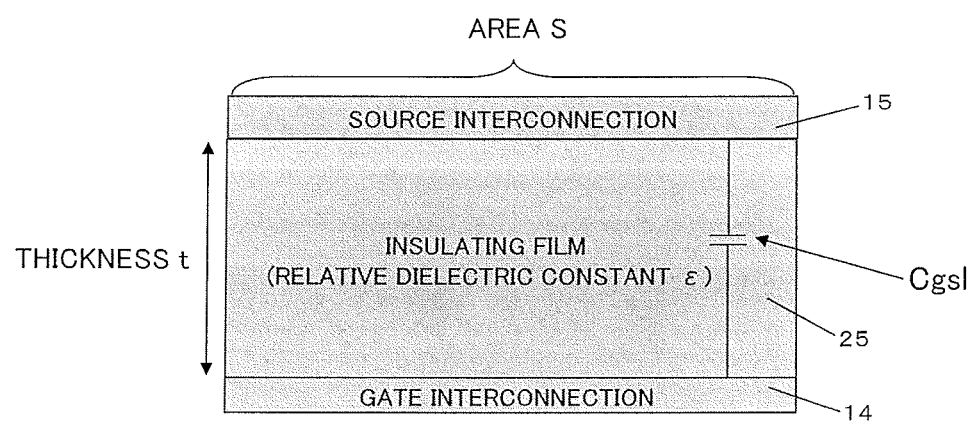
FIG. 8 is a schematic diagram illustrating the capacitance between a source interconnection and a gate interconnection in the semiconductor device according to the first embodiment.

For example, as depicted in FIG. 8, when the gate interconnection 14 and the source interconnection 15 are disposed sandwiching the insulation film 25, the gate interconnection-source interconnection capacitance Cgsl is generated. This gate interconnection-source interconnection capacitance Cgsl can be expressed in the similar manner to the above formula (2). Thus, by increasing the number of locations where the gate interconnection 14 and the source interconnection 15 are disposed sandwiching the insulation film 25, the gate interconnection-source interconnection capacitance Cgsl can be increased.

In this manner, the value of Cgs/Cgd in the above formula (1) can be increased with the interconnection layout.

Thus, a self turn-on can be suppressed by combining the technique to increase the value of Cgs/Cgd in the above formula (1) with the pad layout, and the technique to increase the value of Cgs/Cgd in the above formula (1) with the interconnection layout. This improves flexibility of the design and provides flexibility of adjusting the value of Cgs/Cgd in the above formula (1).

Furthermore, in the configuration of the above-described embodiment, as in a variant of a second embodiment which will be described later (variant wherein a high resistance layer is provided, see FIG. 10), a high resistance layer having a resistance higher than that of the conductive substrate 1 may be provided between the conductive substrate 1 as a conductive layer and the electron transit layer 6. This can prevent leak current to a conductive semiconductor layer 30 as a conductive layer.

Furthermore, while the gate pad 10, the source pad 11, and the drain pad 12 are provided over the element isolation regions 18 in the above-described embodiment, this is not limiting. For example, in the configuration of the above-described embodiment, as in a third embodiment which will be described later, the drain pad 12 may be provided over the element isolation region 18, while the gate pad 10 and the source pad 11 may be provided over the non-element isolation region 19. This makes the n-GaN cap layer 8 and the two-dimensional electron gas layer 20 function as conductive layers which generate capacitances with the respective pads 10 and 11. Such a GaN-HEMT may include the conductive layers 1, 8, and 20 from the pads 10-12 to the back face of the substrate. This improves flexibility of the design and provides flexibility of adjusting the value of Cgs/Cgd in the above formula (1).

[Second Embodiment]

Next, a semiconductor device and a method of manufacturing the same according to a second embodiment will be described with reference to FIG. 9.

The semiconductor device according to the present embodiment is different from the above-described first embodiment in that a conductive layer is provided under the gate pad 10, the source pad 11, and the drain pad 12, and generates capacitances with the respective pads 10-12.

Figure 9:
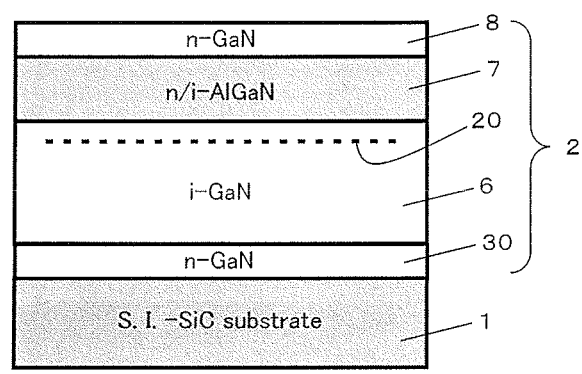
FIG. 9 is a schematic cross-sectional view illustrating the structure of a semiconductor device according to a second embodiment.

More specifically, in the present embodiment, as depicted in FIG. 9, the substrate 1 is a semi-insulating substrate, and a conductive semiconductor layer 30 is provided between the substrate 1 and the electron transit layer 6. This conductive semiconductor layer 30 is a conductive layer provided under the gate pad 10, the source pad 11, and the drain pad 12, and generating capacitances with the respective pads 10-12. Thus, the semiconductor stacked structure 2 includes the conductive semiconductor layer 30. Note that only the semiconductor stacked structure 2 formed over the substrate 1 is depicted for the convenience of illustration in FIG. 9, omitting other elements.

In the present embodiment, the substrate 1 is a semi-insulating SiC substrate.

In addition, the semiconductor stacked structure 2 has a structure wherein a conductive semiconductor layer 30, an i-GaN electron transit layer 6, an n-AlGaN electron supply layer 7 containing an i-AlGaN spacer layer, and n-GaN cap layer 8 are stacked.

In this embodiment, the conductive semiconductor layer 30 is a conductive GaN layer, i.e., an n-type GaN layer, here. Note that the conductive semiconductor layer 30 may be a p-type GaN layer.

Note that the conductive semiconductor layer 30 is not limited to the one listed above. For example, when the conductive semiconductor layer 30 is formed over the substrate 1, i.e., when a conductive buffer layer is provided as a buffer layer formed over the substrate 1, a conductive AlGaN layer, i.e., an n-type AlGaN layer, or a conductive AlN/GaN super-lattice layer, i.e., an n-type AlN/GaN super-lattice layer may be used for the conductive semiconductor layer 30 as a conductive buffer layer. A single conductive semiconductor layer or a plurality of conductive semiconductor layers may be provided as the conductive semiconductor layer 30.

Next, a method of manufacturing the semiconductor device (GaN-HEMT) according to the present embodiment will be described.

Initially, over a semi-insulating SiC substrate 1, an n-GaN layer 30, an i-GaN electron transit layer 6, an n-AlGaN electron supply layer 7 containing an i-AlGaN spacer layer, and an n-GaN cap layer 8 are formed with the MOVPE technique, for example. In this manner, the semiconductor stacked structure 2 including the conductive semiconductor layer 30, the electron transit layer 6, and the electron supply layer 7 is formed over the substrate 1. In this embodiment, the conductive GaN layer 30 has a thickness of about 1 μm.

The present semiconductor device (GaN-HEMT) may be manufactured using the steps similar to those in the above-described first embodiment, in the subsequent steps.

The details of other structures and steps in the manufacturing method are similar to those in the above-described first embodiment, and descriptions thereof will be omitted.

Accordingly, as in the first embodiment described above, the semiconductor device and the method of manufacturing the same according to the present embodiment is advantageous in that a self turn-on is suppressed, thereby achieving stable operations.

A GaN-HEMI was fabricated in accordance with the above-described steps and was mounted on a PFC circuit of a fifth embodiment, which will be described later. The GaN-HEMT was actually operated for 10 minutes and its operation waveform was determined using an oscilloscope, and no self turn-on was observed.

While a semi-insulating SiC substrate is used for the substrate in the above-described embodiment, this is not limiting. For example, as in the above-described first embodiment, the substrate may be a conductive substrate, or may be an insulating substrate (high resistance substrate). Alternatively, the substrate may be other substrates, such as a Si substrate, a GaN substrate, and a sapphire substrate.

Figure 10:
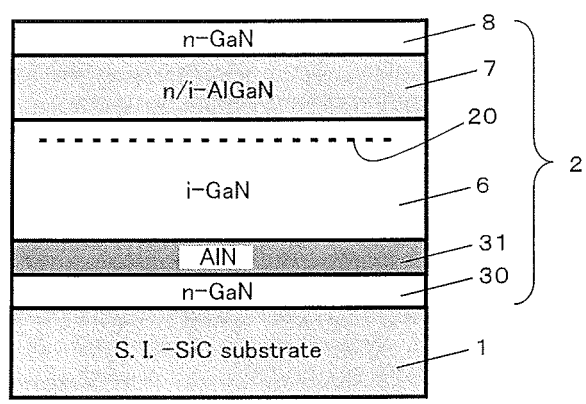
FIG. 10 is a schematic cross-sectional view illustrating the structure of a variant of the semiconductor device according to the second embodiment.

Furthermore, in the configuration of the above-described embodiment, as depicted in FIG. 10, a high resistance layer 31 having a resistance higher than that of the conductive semiconductor layer 30 may be provided between the conductive semiconductor layer 30, as a conductive layer, and the electron transit layer 6. Here, the high resistance layer 31 is an i-AlN layer. This can prevent leak current to a conductive semiconductor layer 30 as a conductive layer.

In this case, the semiconductor stacked structure 2 has a structure wherein an n-GaN layer (conductive semiconductor layer) 30, an i-AlN layer (high resistance layer, insulating layer) 31, an i-GaN electron transit layer 6, an n-AlGaN electron supply layer 7 containing an i-AlGaN spacer layer, and an n-GaN cap layer 8 are stacked. In this embodiment, the i-AlN layer 31 has a thickness of about 100 nm. Note that other configurations are similar to those in the above-described embodiment. The conductive semiconductor layer 30 and the high resistance layer 31 formed between the substrate 1 and the electron transit layer 6 are also referred to as buffer layers.

A GaN-HEMT was fabricated in accordance with the above-described steps and was mounted on a PFC circuit of a fifth embodiment, which will be described later. The GaN-HEMT was actually operated for 10 minutes and its operation waveform was determined using an oscilloscope, and no self turn-on was observed.

Note that the high resistance layer 31 is not limited to the one descried above, and may be any layer including at least one material selected from the group consisting of i-AlN, p-type AlN, i-AlGaN, p-type AlGaN, p-type GaN, Fe-doped GaN, Si oxide, Al oxide, Si nitride, and C (diamond, for example). It should be noted that, when the high resistance layer 31 is a p-type GaN layer, the conductive semiconductor layer 30 as a conductive layer may be any layer other than a p-type GaN layer. If no high resistance layer 31 is provided, the i-GaN electron transit layer 6 can be formed thicker. A single high resistance layer or a plurality of high resistance layers may be provided as the high resistance layer 31. For example, if an Si substrate is used, the withstand voltage can be improved by staking a high resistance layer, a conductive layer, and a high resistance layer, in this order, over the Si substrate.

Furthermore, while the conductive semiconductor layer 30 as a conductive layer is provided under the gate pad 10, the source pad 11, and the drain pad 12 over the entire surface of the substrate 1 in the above-described embodiment, this is not limiting. For example, the conductive semiconductor layer 30 may be provided only in respective regions corresponding to the pads 10-12 under the pads 10-12, and a different semiconductor layer may be provided in other regions, such that the conductive semiconductor layer provided in the respective regions corresponding to the pads 10-12 is connected to each other by that different semiconductor layer. In this case, by adjusting the area of the conductive semiconductor layer provided in the regions corresponding to the gate pad 10 and the source pad 11, the capacitances generated between the conductive semiconductor layer and the gate pad, and between the conductive semiconductor layer and the source pad 11, can be adjusted. Thereby, the gate-source capacitance Cgs can be adjusted, which enables adjustment of the value of Cgs/Cgd in the above formula (1). This improves flexibility of the design and provides flexibility of adjusting the value of Cgs/Cgd in the above formula (1).

Furthermore, as in the variant of the above-described first embodiment, a self turn-on may be suppressed by increasing the value of Cgs/Cgd in the above formula (1) with a combination of the pad layout and the interconnection layout.

Furthermore, while the gate pad 10, the source pad 11, and the drain pad 12 are provided over the element isolation regions 18 in the above-described embodiment, as in the above-described first embodiment, this is not limiting. For example, in the configuration of the above-described embodiment, the drain pad 12 may be provide over the element isolation region 18, while the gate pad 10 and the source pad 11 may be provided over the non-element isolation region 19, as in a third embodiment which will be described later. This makes the n-GaN cap layer 8 and the two-dimensional electron gas layer 20 function as conductive layers which generate capacitances with the respective pads 10 and 11. Such a GaN-HEMT may include the conductive layers 30, 8, and 20 from the pads 10-12 to the back face of the substrate. This improves flexibility of the design and provides flexibility of adjusting the value of Cgs/Cgd in the above formula (1).

[Third Embodiment]

Next, a semiconductor device and a method of manufacturing the same according to a third embodiment will be described with reference to FIG. 11.

Figure 11:
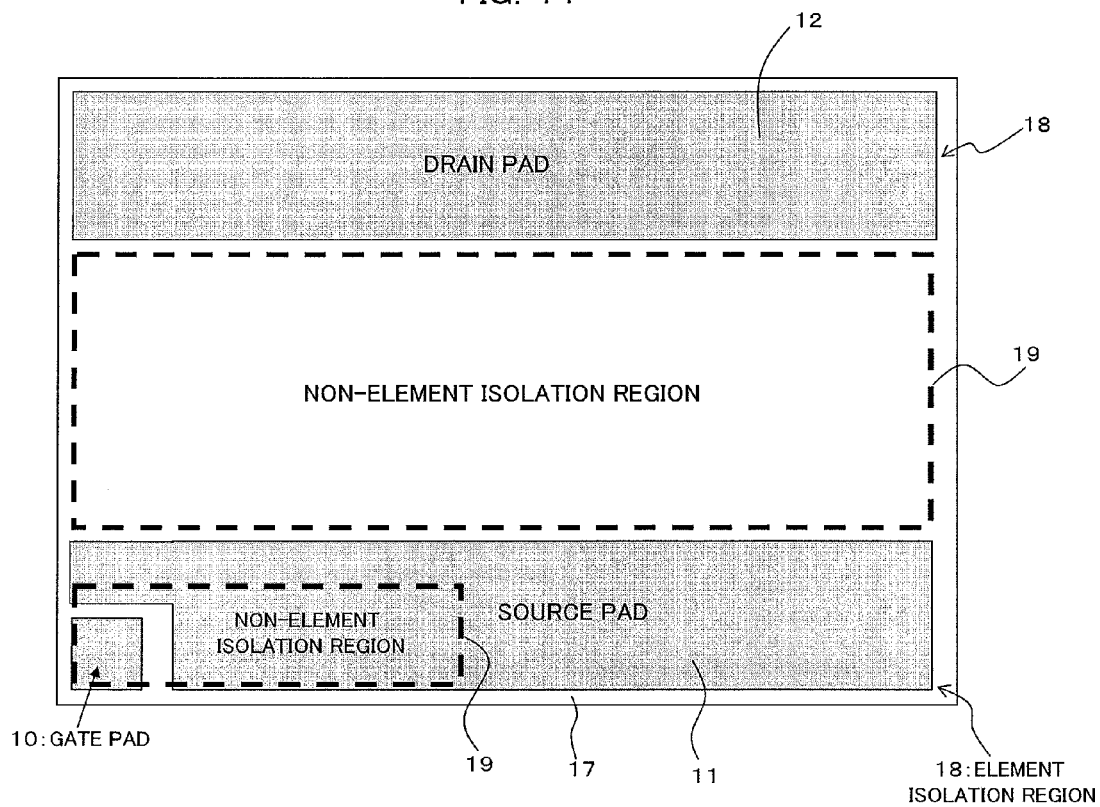
FIG. 11 is a schematic plan view illustrating the structure of a semiconductor device according to a third embodiment.

The semiconductor device according to the present embodiment is different from the above-described first embodiment in that, as depicted in FIG. 11, the gate pad 10 and the source pad 11 are provided over a non-element isolation region 19, and that a different conductive layer is used.

More specifically, this GaN-HEMT includes element isolation regions 18 and a non-element isolation regions 19 other than the element isolation regions 18. Here, the element isolation regions 18 are regions imparted with a high resistance by the element isolation, while the non-element isolation regions 19 are regions not imparted with a high resistance by the element isolation. The drain pad 12 is provided over the element isolation region 18, while the gate pad 10 and the source pad 11 are provided over the non-element isolation region 19. In this embodiment, the entire gate pad 10, a portion of the source pad 11, and the region (spacing) between the gate pad 10 and the source pad 11 are provided over the non-element isolation region 19. In FIG. 11, the regions not enclosed with the dotted lines are the element isolation regions 18.

In this case, the n-GaN cap layer 8 and the two-dimensional electron gas layer 20, located under the gate pad 10 and the source pad 11, i.e., under the entire gate pad 10, a portion of the source pad 11, and the region between the gate pad 10 and the source pad 11, corresponding to these, are not isolated, without being imparted with a high resistance. Thus, the n-GaN cap layer 8 and the two-dimensional electron gas layer 20 included in the semiconductor stacked structure 2 function as conductive layers for generating the capacitance between the gate pad 10 and the source pad 11.

Note that the n-GaN cap layer 8 is also referred to as a conductive cap layer or a conductive semiconductor layer. Furthermore, the two-dimensional electron gas layer 20 is also referred to as a conductive semiconductor layer.

As in the above-described first embodiment, the gate pad 10 and the source pad 11 are connected to the gate electrode 3 and the source electrode 4, via a gate interconnection 14 and a source interconnection 15. An insulation film 17 is formed between the gate pad 10 and the source pad 11. Furthermore, the non-element isolation region 19 is also present under the region between the gate pad 10 and the source pad 11, and the non-element isolation region 19 provided under the gate pad 10 and the non-element isolation region 19 provided under the source pad 11 are connected. Thus, the respective capacitances between the pads 10 and 11 and the conductive layers 8 and 20 are connected to each other via the conductive layers 8 and 20 and the insulation film 17. Furthermore, the distance between the gate pad 10 and the source pad 11 is set such that the gate pad-conductive layer capacitance Cgp and the source pad-conductive layer capacitance Csp is added to the gate-source capacitance Cgs.

As described above, in the present embodiment, by defining the non-element isolation region 19 under the gate pad 10 and the source pad 11, the n-GaN cap layer 8 and the two-dimensional electron gas layer 20 as conductive layers are provided under the gate pad 10 and the source pad 11. Thereby, the respective capacitances are generated between the conductive layers 8 and 20 and the gate pad 10, and between the conductive layers 8 and 20 and the source pad 11. The gate-source capacitance Cgs is increased by using the above-described pad layout, thereby suppressing a self turn-on and enabling stable operations.

Furthermore, in the present embodiment, the element isolation regions 18 are formed under the drain pad 12, and the n-GaN cap layer 8 and the two-dimensional electron gas layer 20 are thus isolated, thereby being imparted with a high resistance. Thus, the n-GaN cap layer 8 and the two-dimensional electron gas layer 20 do not function as conductive layers which generates a capacitance with the drain pad 12. In other words, capacitances of between the n-GaN cap layer 8 and the two-dimensional electron gas layer 20 and the drain pad 12 are prevented from being generated. This prevents an increase in the gate-drain capacitance Cgd.

In other words, in the present embodiment, unlike the above-described first embodiment, the capacitances are generated by providing the conductive layers 8 and 20 under the gate pad 10 and the source pad 11, while preventing a capacitance from being generated under the drain pad 12 by omitting a conductive layer. As described above, with the layout of the gate pad 10 and the source pad 11 and the non-element isolation regions 19, as in the above-described first embodiment, the gate-source capacitance Cgs is increased without causing an increase in the gate-drain capacitance Cgd, thereby increasing the value of Cgs/Cgd in the above formula (1). This suppresses a self turn-on, thereby achieving stable operations.

Furthermore, in the present embodiment, by adjusting the size of the non-element isolation region 19 located under the gate pad 10 and the source pad 11, i.e., the areas of the conductive layers 8 and 20, the capacitances generated between the conductive layers 8 and 20 and the gate pad 10, and between the conductive layers 8 and 20 and the source pad 11 can be adjusted. Thereby, the gate-source capacitance Cgs can be adjusted, which enables adjustment of the value of Cgs/Cgd in the above formula (1). This improves flexibility of the design and provides flexibility of adjusting the value of Cgs/Cgd in the above formula (1).

Furthermore, in the present embodiment, conductive substrate may not be provided under a gate pad, a source pad, and a drain pad, as in the above-described first embodiment. Thus, in the present embodiment, an insulating substrate or a semi-insulating substrate may also be used for the substrate. An SiC substrate, an Si substrate, a GaN substrate, a sapphire substrate, and the like may also be used for the substrate.

In the present embodiment, as in the above-described first embodiment, the pads 10-12 are disposed such that the distance between the gate pad 10 and the source pad 11 is smaller than the distance between the gate pad 10 and the drain pad 12. In other words, the pad layout is designed such that the source pad 11 is disposed close to the gate pad 10, while the drain pad 12 is disposed distant apart from the gate pad 10. However, this pad layout is not limiting, and any layout may be used, as long as the gate pad 10 and the source pad 11 are provided over the non-element isolation region 19, the drain pad 12 is provided over the element isolation region 18, and the source pad 11 is located close to the gate pad 10.

Next, a method of manufacturing the semiconductor device (GaN-HEMT) according to the present embodiment will be described.

Initially, as in the above-described first embodiment, over the substrate 1 (insulating SiC substrate, for example, in this embodiment), an i-GaN electron transit layer 6, an n-AlGaN electron supply layer 7 containing an i-AlGaN spacer layer, and an n-GaN cap layer 8 are formed with the MOVPE technique, for example (see FIG. 6A). In this process, the semiconductor stacked structure 2 including the electron transit layer 6 and the electron supply layer 7 is formed over the substrate 1.

Subsequently, a resist film having an openings in the regions wherein element isolation regions are to be formed, is formed over the n-GaN cap layer 8 with photolithography, for example. Then, element isolation regions 18 are formed with dry etching using a chlorine-based gas or ion implant for providing element isolation, for example (see FIG. 6B). In this embodiment, ion implant is performed from the front face side of the semiconductor stacked structure 2 to the depth of some midpoint of the i-GaN electron transit layer 6 to form the element isolation regions 18. In this step, the region over which the entire gate pad 10, a portion of the source pad 11, and the spacing between the gate pad 10 and the source pad 11 are to be formed, is not isolated, thereby defining a non-element isolation region. The resist film is then removed.

Subsequently, as in the above-described first embodiment, the gate electrode 3, the source electrode 4, and the drain electrode 5 are formed over the semiconductor stacked structure 2 (see FIGS. 6C, 6D, and 7A).

Subsequently, as in the above-described first embodiment, an insulation film 25 and an interconnection layer 13 including metal interconnections 14-16, and bonding pads 10-12 are formed (see FIG. 7B).

It should be noted that, in the present embodiment, a drain pad 12 is formed over the element isolation region 18, while a gate pad 10 and a source pad 11 are formed over the non-element isolation region 19 other than the element isolation regions 18. In this embodiment, the gate pad 10 and the source pad 11 are formed such that the entire gate pad 10, a portion of the source pad 11, and the region between the gate pad 10 and the source pad 11 are located over the non-element isolation region 19.

Furthermore, as in the above-described first embodiment, the gate pad 10 and the source pad 11 are formed such that the distance between the gate pad 10 and the source pad 11 becomes a distance being capable of adding the gate pad-conductive layer capacitance Cgp and the source pad-conductive layer capacitance Csp to the gate-source capacitance Cgs.

The semiconductor device (GaN-HEMT) according to the present embodiment may be fabricated in the steps set forth above.

The details of other structures and steps in the manufacturing method are similar to those in the above-described first embodiment, and descriptions thereof will be omitted.

Accordingly, as in the first embodiment described above, the semiconductor device and the method of manufacturing the same according to the present embodiment is advantageous in that a self turn-on is suppressed, thereby achieving stable operations.

While the semiconductor stacked structure 2 includes the n-GaN cap layer 8 over the electron supply layer 7 in the above-described embodiment, this is not limiting and the n-GaN cap layer 8 may be omitted. In such a case, the two-dimensional electron gas layer 20 included in the semiconductor stacked structure 2 will function as a conductive layer that generates the respective capacitances with the gate pad 10, and with the source pad 11.

Furthermore, while the above-described embodiment has been described wherein the n-GaN cap layer 8 and the two-dimensional electron gas layer 20 included in the semiconductor stacked structure 2 function as conductive layers that generate the respective capacitances with the gate pad 10, and with the source pad 11, this is not limiting. For example, if a different type of semiconductor stacked structure is used, the different semiconductor layer may function as a conductive layer that generates the respective capacitances with the gate pad 10, and with the source pad 11.

Furthermore, while the region corresponding to the spacing between the gate pad 10 and the source pad 11 also defines the non-element isolation region 19 such that the non-element isolation region 19 corresponding to the gate pad 10 and the non-element isolation region 19 corresponding to the source pad 11 are connected by the conductive layer in the above-described embodiment, this is not limiting. For example, the region corresponding to the spacing between the gate pad 10 and the source pad 11 may define an element isolation region 18 such that the non-element isolation region 19 corresponding to the gate pad 10 and the non-element isolation region 19 corresponding to the source pad 11 are connected via this element isolation region 18.

Furthermore, as in the variant of the above-described first embodiment, a self turn-on may be suppressed by increasing the value of Cgs/Cgd in the above formula (1) with a combination of the pad layout and the interconnection layout.

[Fourth Embodiment]

Next, a semiconductor device and a method of manufacturing the same according to a fourth embodiment will be described with reference to FIG. 12.

Figure 12:
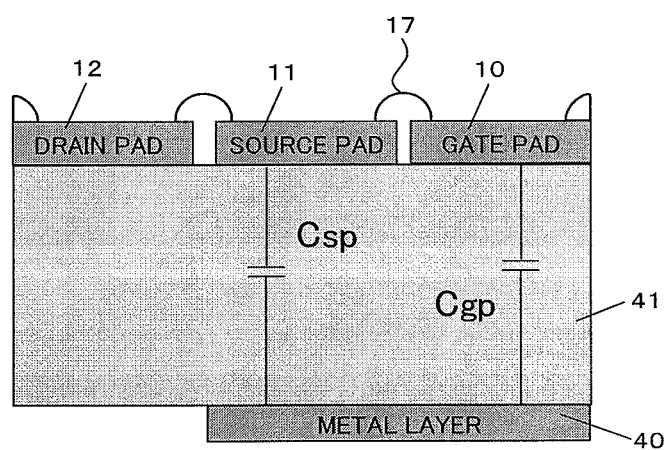
FIG. 12 is a schematic cross-sectional view illustrating the structure of a semiconductor device according to a fourth embodiment.

The semiconductor device according to the present embodiment is different from the above-described first embodiment in that, as depicted in FIG. 12, a metal layer 40 is provided as a conductive layer.

In other words, this semiconductor device includes pads 10-12 over a structure 41 of the above-described first embodiment (see FIG. 1) including a substrate 1, a semiconductor stacked structure 2, an insulation film 9, electrodes 3-5, and an interconnection layer 13, and further includes a metal layer 40 as a conductive layer, over the back face of the substrate 1.

In this embodiment, the metal layer 40 is provided over the back face of the substrate 1, only under the gate pad 10 and the source pad 11. More specifically, the metal layer 40 is provided, under the gate pad 10 and the source pad 11, in regions corresponding to the gate pad 10, the source pad 11, and the spacing between the gate pad 10 and the source pad 11. In contrast, no metal layer 40 is provided in the region under the drain pad 12, corresponding to the drain pad 12. Thus, the metal layer 40 is the conductive layer that generates the respective capacitances with the gate pad 10, and with the source pad 11.

As in the above-described first embodiment, the gate pad 10 and the source pad 11 are connected to the gate electrode 3 and the source electrode 4, via a gate interconnection 14 and a source interconnection 15, respectively. An insulation film 17 is formed between the gate pad 10 and the source pad 11. The metal layer 40 is also provided under the region between the gate pad 10 and the source pad 11, and the metal layer provided under the gate pad 10 and the metal layer provided under the source pad 11 are connected. Thus, the respective capacitances between the pads 10 and 11 and the metal layer 40 as a conductive layer are connected to each other via the conductive layer 40 and the insulation film 17. Furthermore, the distance between the gate pad 10 and the source pad 11 is set such that the gate pad-conductive layer capacitance Cgp and the source pad-conductive layer capacitance Csp is added to the gate-source capacitance Cgs.

As described above, in the present embodiment, by providing the metal layer 40 as a conductive layer under the gate pad 10 and the source pad 11, the capacitances between the conductive layer 40 and the gate pad 10, and between the conductive layer 40 and the source pad 11, are generated. The gate-source capacitance Cgs is increased by using the above-described pad layout, thereby suppressing a self turn-on and enabling stable operations.

Furthermore, in the present embodiment, the metal layer 40 as a conductive layer is not provided under the drain pad 12, preventing a capacitance with the drain pad 12 from being generated. This prevents an increase in the gate-drain capacitance Cgd.

In other words, in the present embodiment, unlike the above-described first embodiment, the capacitances are generated by providing the conductive layer 40 under the gate pad 10 and the source pad 11, while preventing a capacitance from being generated without providing the conductive layer 40 under the drain pad 12. As described above, with the layout of the gate pad 10 and the source pad 11 and the metal layer 40, as in the above-described first embodiment, the gate-source capacitance Cgs is increased without causing an increase in the gate-drain capacitance Cgd, thereby increasing the value of Cgs/Cgd in the above formula (1). This suppresses a self turn-on, thereby achieving stable operations.

Furthermore, in the present embodiment, by adjusting the area of the conductive layer 40 located under the gate pad 10 and the source pad 11, the capacitances generated between the conductive layer 40 and the gate pad 10, and between the conductive layer 40 and the source pad 11 can be adjust. Thereby, the gate-source capacitance Cgs can be adjusted, which enables adjustment of the value of Cgs/Cgd in the above formula (1). This improves flexibility of the design and provides flexibility of adjusting the value of Cgs/Cgd in the above formula (1).

Furthermore, since the present embodiment includes the metal layer 40 as a conductive layer, no conductive substrate as a conductive layer is required under the pads 10-12, as in the above-described first embodiment. Thus, in this embodiment, an insulating substrate or a semi-insulating substrate may be used for the substrate 1. An SiC substrate, an Si substrate, a GaN substrate, a sapphire substrate, and the like may be used for the substrate 1. It should be noted that, by using an insulating substrate or a semi-insulating substrate for the substrate 1, leak current to the metal layer 40 as a conductive layer can be prevented, as in the variant of the above-described second embodiment (the embodiment with a high resistance layer).

Note that in the present embodiment, the drain pad 12 may be disposed apart from the gate pad 10 or the drain pad 12 may be closer to the gate pad 10, as long as the metal layer 40 is provided under the gate pad 10 and the source pad 11, the metal layer 40 is not provided under the drain pad 12, and the source pad 11 is located close to the gate pad 10.

The details of other structures and steps in the manufacturing method are similar to those in the above-described first embodiment, and descriptions thereof will be omitted.

Accordingly, as in the first embodiment described above, the semiconductor device and the method of manufacturing the same according to the present embodiment is advantageous in that a self turn-on is suppressed, thereby achieving stable operations.

While the metal layer 40 as a conductive layer is provided over the back face of the substrate 1 in the above-described embodiment, this is not limiting and a conductive semiconductor layer may be provided, as a conductive layer, over the back face of the substrate 1.

Furthermore, while the metal layer 40 is provided in the region corresponding to the spacing between the gate pad 10 and the source pad 11 such that the metal layer provided in the region corresponding to the gate pad 10 and the metal layer provided in the region corresponding to the source pad 11 are connected by the metal layer in the above-described embodiment, this is not limiting. For example, an insulation film may be provided in the region corresponding to the spacing between the gate pad 10 and the source pad 11, such that the metal layer provided in the region corresponding to the gate pad 10 and the metal layer provided in the region corresponding to the source pad 11 are connected by this insulation film.

Furthermore, as in the variant of the above-described first embodiment, a self turn-on may be suppressed by increasing the value of Cgs/Cgd in the above formula (1) with a combination of the pad layout and the interconnection layout.

Furthermore, as in the above-described first embodiment, while the gate pad 10, the source pad 11, and the drain pad 12 are provided over the element isolation regions 18 in the above-described embodiment, this is not limiting. For example, in the configuration of the above-described embodiment, as in the third embodiment described above, the drain pad 12 may be provided over the element isolation region 18, while the gate pad 10 and the source pad 11 may be provided over the non-element isolation region 19. This makes the n-GaN cap layer 8 and the two-dimensional electron gas layer 20 function as conductive layers which generate capacitances with the respective pads 10 and 11. Such a GaN-HEMT may include the conductive layer 40 over the back face of the substrate, and further include the conductive layers 8 and 20 somewhere from the pads 10 and 11 to the back face of the substrate. This improves flexibility of the design and provides flexibility of adjusting the value of Cgs/Cgd in the above formula (1).

[Fifth Embodiment]

Next, a semiconductor device and a method of manufacturing the same and a power supply apparatus according to a fifth embodiment will be described with reference to FIGS. 13 and 14.

The semiconductor device according to the present embodiment is a semiconductor package including, as a semiconductor chip, a semiconductor device (GaN-HEMT) according to any one of the above-described first to fourth embodiments and their variants. Note that such a semiconductor chip is also referred to as a HEMT chip.

Hereinafter, the embodiment will be described with reference to a discrete package, as an example.

Figure 13:
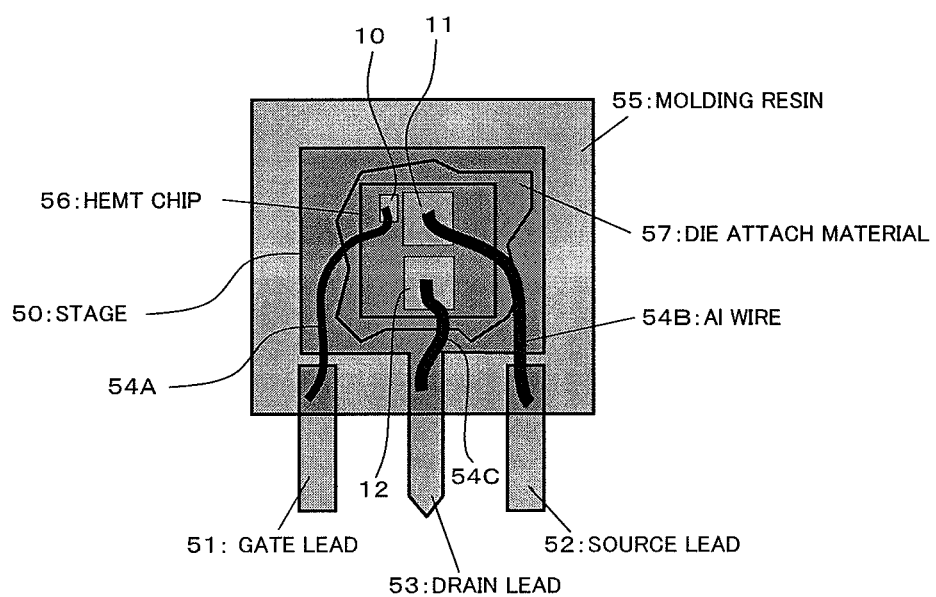
FIG. 13 is a schematic plan view illustrating the structure of a semiconductor device (semiconductor package) according to a fifth embodiment.

As depicted in FIG. 13, this semiconductor device includes a stage 50 mounting a semiconductor chip according to any one of the above-described first to fourth embodiments and their variants, a gate lead 51, a source lead 52, a drain lead 53, bonding wires 54A-54C (Al wires, in this embodiment), and an encapsulation resin 55. Note that the encapsulation resin is also referred to as a molding resin.

The gate pad 10, the source pad 11, and the drain pad 12 in the semiconductor chip 56 mounted on the stage 50 are connected to the gate lead 51, the source lead 52 and the drain lead 53 through the Al wire 54A-54C, respectively, which then undergoes resin encapsulation.

In this embodiment, the stage 50, to which the back face of the substrate in the semiconductor chip 56 is secured with a die attach material 57 (solder, in this embodiment), is electrically connected to the drain lead 53. Note that the configuration is not limited to the one described above, and the stage 50 may be electrically connected to the source lead 52.

Next, a method of manufacturing the semiconductor device (discrete package) according to the present embodiment will be described.

Initially, a semiconductor chip 56 (GaN-HEMT) according to any one of the above-described first to fourth embodiments and their variants is secured on the stage 50 of a lead frame, with the die attach material 57 (solder, in this embodiment), for example.

Subsequently, the gate pad 10, the drain pad 12, and the source pad 11 in the semiconductor chip 56 are connected to the gate lead 51, the drain lead 53, and the source lead 52, through bonding with the Al wire 54A-54C, respectively, for example.

After resin encapsulation using the transfer mold technique, for example, the lead frame is separated.

The semiconductor device according to the present embodiment (discrete package) may be fabricated in the steps set forth above.

While this embodiment has been described with reference to the discrete package wherein the pads 10-12 in the semiconductor chip 56 are used as bonding pads for wire bonding in this embodiment, this is not limiting and other semiconductor packages may also be used. For example, a semiconductor package may be used wherein pads in the semiconductor chip are used as bonding pads for wireless bonding, such as flip chip bonding, for example. A wafer level package may also be used. Alternatively, semiconductor packages other than a discrete package may also be used.

Next, a power supply apparatus including a semiconductor package including the above-described GaN-HEMT will be described with reference to FIG. 14.

Hereinafter, an embodiment will be described with reference to an example wherein a GaN-HEMT (see FIGS. 13 and 1) included in the above-described semiconductor package is used in a power factor correction (PFC) circuit provided in a power supply apparatus for a server.

Figure 14:
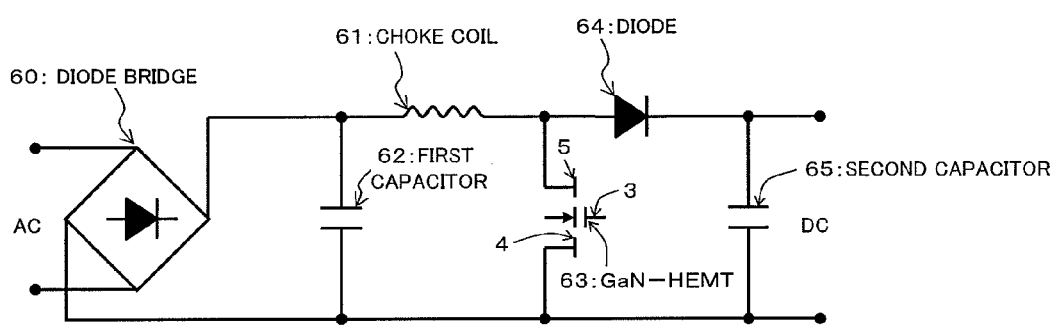
FIG. 14 is a cross-sectional view illustrating the structure of a PFC circuit included in a power supply apparatus according to the fifth embodiment.

As depicted in FIG. 14, this PFC circuit includes diode bridge 60, a choke coil 61, a first capacitor 62, a GaN-HEMT 63 included in the above-described semiconductor package, a diode 64, and a second capacitor 65.

In this embodiment, this PFC circuit is configured to include the diode bridge 60, the choke coil 61, the first capacitor 62, GaN-HEMT 63 included in the above-described semiconductor package, the diode 64, and the second capacitor 65, mounted over a circuit substrate.

In the present embodiment, the drain lead 53, the source lead 52, and the gate lead 51 in the above-described semiconductor package are inserted into a drain lead slot, a source lead slot and a gate lead slot in the circuit substrate, respectively, and are then secured with solder, for example. In this manner, the GaN-HEMT 63 included in the above-described semiconductor package is connected to the PFC circuit formed on the circuit substrate.

In this PFC circuit, one terminal of the choke coil 61 and the anode terminal of the diode 64 are connected to the drain electrode 5 in the GaN-HEMT 63. One terminal of the first capacitor 62 is connected to the other terminal of the choke coil 61, and one terminal of the second capacitor 65 is connected to the cathode terminal of the diode 64. The other terminal of the first capacitor 62, the source electrode 4 in the GaN-HEMT 63 and the other terminal of the second capacitor 65 are grounded. A pair of terminals of the diode bridge 60 is connected to the two terminals of the first capacitor 62, and the other pair of terminals of the diode bridge 60 is connected to input terminals for receiving an alternating current (AC) voltage. The two terminals of the second capacitor 65 are connected to output terminals for outputting a direct current (DC) voltage. A gate driver, which is not illustrated, is connected to the gate electrode 3 in the GaN-HEMT 63. In this PFC circuit, by activating the GaN-HEMT 63 by the gate driver, an AC voltage received through the input terminals is converted into a DC voltage, which is output from the output terminals.

Accordingly, the power supply apparatus according to the present embodiment has an advantage of improving the reliability. More specifically, since this power supply apparatus has a semiconductor chip 56 according to any one of the above-described first to fourth embodiments and their variants, a self turn-on is suppressed, thereby achieving stable operations. As a result, a liable power supply apparatus can be constructed.

While the above-described embodiment has been described wherein the above-described semiconductor device (GaN-HEMT or semiconductor package including a GaN-HEMT) is used in a PFC circuit provided in a power supply apparatus for a server, this is not limiting. For example, the above-described semiconductor device (GaN-HEMT or semiconductor package including a GaN-HEMT) may also be used in electronic appliances (electronic apparatuses), such as non-server computers. Alternatively, the above-described semiconductor device (semiconductor package) may also be used for other circuits provided in a power supply apparatuses (e.g., DC-DC converters).

[Others]

Note that the present disclosure is not limited to the configurations of the embodiments and their variants set forth above, and may be modified in various manners without departing from the sprit of the present disclosure.

For example, the combinations of elements described in the above-described embodiments and their variants are merely exemplary, and any combinations of the embodiments and their variants are possible.

Furthermore, while the above-described embodiments and their variants have been described with reference to an MIS transistor including a gate insulation film, this is not limiting and Schottky transistors may also be used. Alternatively, a structure with a gate recess under a gate electrode may also be used.

While the structures of a gate electrode, a source electrode, and a drain electrode are not limited to those in the above-described embodiments and their variants, and a single layer structure may be used or other materials may be used.

All examples and conditional language recited herein are intended for pedagogical purposes to aid the reader in understanding the invention and the concepts contributed by the inventor to furthering the art, and are to be construed as being without limitation to such For example recited examples and conditions, nor does the organization of such examples in the specification relate to a illustrating of the superiority and inferiority of the invention. Although the embodiments have been described in detail, it should be understood that the various changes, substitutions, and alterations could be made hereto without departing from the spirit and scope of the invention.

What is claimed is:

1. A semiconductor device comprising:
   a substrate;
   a semiconductor stacked structure, provided over the substrate, comprising an electron transit layer and an electron supply layer;
   a gate electrode, a source electrode, and a drain electrode provided over the semiconductor stacked structure;
   a gate pad, a source pad, and a drain pad provided over the gate electrode, the source electrode, and the drain electrode, and connected to the gate electrode, the source electrode, and the drain electrode, respectively; and
   a conductive layer,
   wherein the conductive layer is provided under the gate pad, the source pad, and the drain pad, a distance between the gate pad and the source pad is a distance being capable of adding a gate pad-conductive layer capacitance and a source pad-conductive layer capacitance to a gate-source capacitance, a distance between the gate pad and the drain pad is a distance not being capable of adding a gate pad-conductive layer capacitance and a drain pad-conductive layer capacitance to a gate-drain capacitance, and a value of Cgs/Cgd, where Cgs is the gate-source capacitance and Cgd is the gate-drain capacitance, is set such that a self turn-on which is a phenomenon that a gate voltage exceeds a threshold voltage when a transistor is turned off does not occur.

2. The semiconductor device according to claim 1, wherein the substrate is a conductive substrate or a substrate including a conductive layer, and the conductive layer is the conductive substrate or the conductive layer included in the substrate.

3. The semiconductor device according to claim 1, wherein the semiconductor stacked structure comprises a conductive semiconductor layer, and the conductive layer is the conductive semiconductor layer.

4. The semiconductor device according to claim 3, wherein the conductive semiconductor layer is provided between the substrate and the electron transit layer.

5. The semiconductor device according to claim 3, wherein the substrate is a semi-insulating substrate or an insulating substrate.

6. The semiconductor device according to claim 1, further comprising a high resistance layer, having a resistance higher than that of the conductive layer, between the conductive layer and the electron transit layer.

7. The semiconductor device according to claim 1, further comprising:
   an element isolation region imparted with a high resistance by an element isolation; and
   a non-element isolation region not imparted with a high resistance by the element isolation,
   the gate pad, the source pad, and the drain pad are provided over the element isolation region.

8. The semiconductor device according to claim 1, further comprising:
   an element isolation region region imparted with a high resistance by an element isolation; and
   a non-element isolation region not imparted with a high resistance by the element isolation,
   wherein the drain pad is provided over the element isolation region, and the gate pad and the source pad are provided over the non-element isolation region.

9. A semiconductor device comprising:
   a substrate;
   a semiconductor stacked structure, provided over the substrate, comprising an electron transit layer and an electron supply layer;
   a gate electrode, a source electrode, and a drain electrode provided over the semiconductor stacked structure;
   a gate pad, a source pad, and a drain pad provided over the gate electrode, the source electrode, and the drain electrode, and connected to the gate electrode, the source electrode, and the drain electrode, respectively; and
   a conductive layer,
   wherein the conductive layer is provided over a back face of the substrate and below the gate pad and the source pad, a distance between the gate pad and the source pad is a distance being capable of adding a gate pad-conductive layer capacitance and a source pad-conductive layer capacitance to a gate-source capacitance, and a value of Cgs/Cgd, where Cgs is the gate-source capacitance and Cgd is a gate-drain capacitance, is set such that a self turn-on which is a phenomenon that a gate voltage exceeds threshold voltage when a transistor is turned off does not occur.

10. The semiconductor device according to claim 9, wherein the substrate is a semi-insulating substrate or an insulating substrate.

11. The semiconductor device according to claim 9, further comprising an element isolation region, imparted with a high resistance by an element isolation, and a non-element isolation region not imparted with a high resistance by the element isolation,
wherein the gate pad, the source pad, and the drain pad are provided over the element isolation region.

12. The semiconductor device according to claim 9, wherein an element isolation region imparted with a high resistance by an element isolation, and a non-element isolation region not imparted with a high resistance by the element isolation, the drain pad is provided over the element isolation region, and the gate pad and the source pad are provided over the non-element isolation region.

13. A semiconductor device comprising:
a substrate;
a semiconductor stacked structure, provided over the substrate, comprising an electron transit layer and an electron supply layer;
a gate electrode, a source electrode, and a drain electrode provided over the semiconductor stacked structure;
a gate pad, a source pad, and a drain pad provided over the gate electrode, the source electrode, and the drain electrode, and connected to the gate electrode, the source electrode, and the drain electrode, respectively;
an element isolation region imparted with a high resistance by an element isolation; and
a non-element isolation region not imparted with a high resistance by the element isolation,
wherein the drain pad is provided over the element isolation region, and the gate pad and the source pad are provided over the non-element isolation region.

14. The semiconductor device according to claim 13, wherein the semiconductor stacked structure comprises a conductive cap layer over the electron supply layer.

15. The semiconductor device according to claim 1, further comprising:
a gate interconnection connecting the gate electrode and the gate pad;
a source interconnection connecting the source electrode and the source pad;
a drain interconnection connecting the drain electrode and the drain pad; and
an insulation film provided among the gate interconnection, the source interconnection, and the drain interconnection,
the gate interconnection, the source interconnection, and the drain interconnection are provided such that a number of locations where the gate interconnection and the source interconnection are disposed on opposite sides of the insulation film sandwiching the insulation film is greater than a number of locations where the gate interconnection and the drain interconnection are disposed on opposite sides of the insulation film sandwiching the insulation film.

16. A semiconductor device comprising:
a semiconductor chip having the structure according claim 1;
a stage mounting the semiconductor chip;
a gate lead connected to the gate pad in the semiconductor chip;
a source lead connected to the source pad in the semiconductor chip;
a drain lead connected to the drain pad in the semiconductor chip; and
an encapsulation resin.

17. A power supply apparatus comprising the semiconductor device according to claim 1.

18. A method of manufacturing a semiconductor device, comprising:
forming a semiconductor stacked structure including an electron transit layer and an electron supply layer, over a conductive substrate or a substrate including a conductive layer;
forming a gate electrode, a source electrode, and a drain electrode over the semiconductor stacked structure;
forming a gate pad, a source pad, and a drain pad over the gate electrode, the source electrode, and the drain electrode such that the gate pad, the source pad, and the drain pad are connected to the gate electrode, the source electrode, and the drain electrode, respectively, and
wherein the gate pad, the source pad, and the drain pad are formed over the conductive substrate or the substrate including the conductive layer, a distance between the gate pad and the source pad is a distance being capable of adding a gate pad-conductive layer capacitance and a source pad-conductive layer capacitance to a gate-source capacitance, a distance between the gate pad and the drain pad, is a distance not being capable of adding a gate pad-conductive layer capacitance and a drain pad-conductive layer capacitance to a gate-drain capacitance, and a value of Cgs/Cgd, where Cgs is the gate-source capacitance and Cgd is the gate-drain capacitance, is set such that a self turn-on which is a phenomenon that a gate voltage exceeds a threshold voltage when a transistor is turned off does not occur.

19. A method of manufacturing a semiconductor device, comprising:
forming a semiconductor stacked structure including an electron transit layer and an electron supply layer, over a substrate;
forming a gate electrode, a source electrode, and a drain electrode over the semiconductor stacked structure;
forming a gate pad, a source pad, and a drain pad over the gate electrode, the source electrode, and the drain electrode, such that the gate pad, the source pad, and the drain pad are connected to the gate electrode, the source electrode, and the drain electrode, respectively; and
forming a conductive layer,
wherein the conductive layer is provided over a back face of the substrate and below the gate pad and the source pad, a distance between the gate pad and the source pad is a distance being capable of adding a gate pad-conductive layer capacitance and a source pad-conductive layer capacitance to a gate-source capacitance, and a value of Cgs/Cgd, where Cgs is the gate-source capacitance and Cgd is a gate-drain capacitance, is set such that a self turn-on which is a phenomenon that a gate voltage exceeds a threshold voltage when a transistor is turned off does not occur.

20. A method of manufacturing a semiconductor device, comprising:
forming a semiconductor stacked structure including an electron transit layer and an electron supply layer, over a substrate;

forming an element isolation region imparted with a high resistance by an element isolation;
forming a gate electrode, a source electrode, and a drain electrode over the semiconductor stacked structure;
forming a drain pad over the element isolation region such that a gate pad, a source pad, and the drain pad is connected to the gate electrode, the source electrode, and the drain electrode over the gate electrode, the source electrode, and the drain electrode, respectively, and forming the gate pad and the source pad over a non-element isolation region not imparted with a high resistance by the element isolation.

* * * * *

UNITED STATES PATENT AND TRADEMARK OFFICE
CERTIFICATE OF CORRECTION

PATENT NO. : 8,716,748 B2  
APPLICATION NO. : 13/267212  
DATED : May 6, 2014  
INVENTOR(S) : Tadahiro Imada et al.

Page 1 of 1

It is certified that error appears in the above-identified patent and that said Letters Patent is hereby corrected as shown below:

On the Title Page: Amend

Item (30)  Foreign Application Priority Data  
~~March 12, 2010~~     (JP) ..................................... ~~2010-270469~~

December 3, 2010    (JP) ..................................... 2010-270469

Signed and Sealed this  
First Day of July, 2014

Michelle K. Lee  
*Deputy Director of the United States Patent and Trademark Office*